US010214002B2

(12) United States Patent
Pang (10) Patent No.: US 10,214,002 B2
(45) Date of Patent: Feb. 26, 2019

(54) THREE DIMENSIONAL PRINTING APPARATUS AND THREE DIMENSIONAL PRINTING METHOD THEREOF (71) Applicants: XYZprinting, Inc., New Taipei (TW); Kinpo Electronics, Inc., New Taipei (TW)

(72) Inventor: Bo Pang, New Taipei (TW)

(73) Assignees: XYZprinting, Inc., New Taipei (TW); Kinpo Electronics, Inc., New Taipei (TW)

( * ) Notice: Subject to any disclaimer, the term of this patent is extended or adjusted under 35 U.S.C. 154(b) by 205 days.

(21) Appl. No.: 15/281,076

(22) Filed: Sep. 30, 2016

(65) Prior Publication Data
US 2018/0093427 A1   Apr. 5, 2018

(51) Int. Cl.
| B29C 67/00 | (2017.01) |
| B33Y 10/00 | (2015.01) |
| B33Y 30/00 | (2015.01) |
| B33Y 50/02 | (2015.01) |
| G03F 7/00  | (2006.01) |
| G03F 7/20  | (2006.01) |
| B29C 64/124 | (2017.01) |
| B29C 64/241 | (2017.01) |
| B29C 64/135 | (2017.01) |
| B29C 64/20  | (2017.01) |
| B29C 64/386 | (2017.01) |

(52) U.S. Cl.
CPC ............ *B33Y 10/00* (2014.12); *B29C 64/124* (2017.08); *B29C 64/135* (2017.08); *B29C 64/20* (2017.08); *B29C 64/241* (2017.08); *B29C 64/386* (2017.08); *B33Y 30/00* (2014.12); *B33Y 50/02* (2014.12); *G03F 7/0037* (2013.01); *G03F 7/70416* (2013.01)

(58) Field of Classification Search
CPC ..... B29C 64/124; B29C 64/241; B33Y 30/00; B33Y 10/00
See application file for complete search history.

(56) References Cited

U.S. PATENT DOCUMENTS 9,796,138 B2 * 10/2017 Liska ................. A61C 13/0013
9,862,139 B2 *  1/2018 Pang ....................... B29C 64/20
(Continued)

OTHER PUBLICATIONS

"Search Report of Europe Counterpart Application", dated Jun. 27, 2017, p. 1-p. 7.

*Primary Examiner* — Jason L Lazorcik
(74) *Attorney, Agent, or Firm* — JCIPRNET (57) ABSTRACT

A three dimensional printing apparatus including a tank containing a liquid forming material, a platform movably disposed in the tank to be immersed in or moved out of the liquid forming material, a curing device disposed next to the tank or the platform, and a controlling device electrically connected to the curing device and at least one of the tank and the platform is provided. An inner bottom of the tank has a first portion and a second portion in step manner, the first portion is higher than the second portion. The controlling device drives the tank and the platform to move relative to each other. A solidified layer is formed by curing the liquid forming material between the platform and the first portion and peeled off by rotating the tank relative to the platform. A three dimensional printing method is also disclosed.

10 Claims, 4 Drawing Sheets

(56) References Cited

U.S. PATENT DOCUMENTS

| | | | |
|---|---|---|---|
| 2011/0309554 A1* | 12/2011 | Liska | A61C 13/0013 |
| | | | 264/401 |
| 2014/0227382 A1 | 8/2014 | Liska et al. | |
| 2014/0339741 A1* | 11/2014 | Aghababaie | B29C 64/255 |
| | | | 264/401 |
| 2015/0360419 A1* | 12/2015 | Willis | B29C 67/0085 |
| | | | 425/174.4 |
| 2016/0096332 A1* | 4/2016 | Chen | B29C 67/0088 |
| | | | 425/162 |
| 2016/0129631 A1* | 5/2016 | Chen | B29C 67/0062 |
| | | | 425/150 |
| 2016/0325505 A1* | 11/2016 | Ou | B29C 67/0088 |
| 2017/0266888 A1* | 9/2017 | Pang | B29C 64/20 |
| 2018/0133978 A1* | 5/2018 | Yen | B29C 67/007 |
| 2018/0133984 A1* | 5/2018 | Lu | B29C 67/0088 |

\* cited by examiner

THREE DIMENSIONAL PRINTING APPARATUS AND THREE DIMENSIONAL PRINTING METHOD THEREOF

BACKGROUND

Field

The disclosure relates to a three dimensional printing apparatus and a three dimensional printing method.

Description of Related Art

As technology progresses, different methods of forming three dimensional (3-D) models through additive manufacturing technology have been proposed. Generally, additive manufacturing technology uses the design information of 3-D models from software such as computer-aided design (CAD) to be converted to multiple thin cross sections (quasi-two-dimensional) continuously stacked.

Presently, multiple techniques for forming a plurality of thin cross sections have already been developed. For example, a moving platform may be disposed in liquid forming material, and a light source may be driven according to the x-y-z coordinates of the design information of the 3-D model. The light source is driven along the x-y coordinates to irradiate the liquid forming material. Then the liquid forming material cures to become the correct cross sectional shape. Next, as the moving platform moves along the z-axis, the cured material that is cured layer by layer may be formed into a three dimensional object.

SUMMARY

The disclosure provides a three dimensional printing apparatus and a three dimensional printing method that are capable of effectively separating solidified layers to improve the printing efficiency.

In addition, it is beneficial to increasing the printing accuracy, extending the scope of printable objects, and increasing structural strength of a printed three dimensional object.

A three dimensional printing apparatus including a tank containing a liquid forming material, a platform movably disposed in the tank to be immersed in or out of the liquid forming material, a curing device disposed next to the tank or the platform, and a controlling device electrically connected to the curing device and at least one of the tank and the platform is provided. An inner bottom of the tank has a first portion and a second portion in step manner, and the first portion is higher than the second portion. The controlling device drives the tank and the platform to rotate relatively, so a region of the platform may be corresponding to the first portion or the second portion. When the region is corresponding to the first portion, the curing device cures the liquid forming material between the platform and the first portion to form a solidified layer, and then the controlling device rotates the tank and the platform relative to each other to peel off the solidified layer from the first portion and move the solidified layer to a position corresponding to the second portion.

A three dimensional printing method of the disclosure is applicable to a three dimensional printing apparatus. The three dimensional printing apparatus includes a tank, a platform, a curing device, and a controlling device. The tank contains a liquid forming material, an inner bottom of the tank has a first portion and a second portion in step manner, and the first portion is higher than the second portion. The platform is movably disposed in the tank to be immersed in or moved out of the liquid forming material. The curing device is disposed next to the tank or the platform. The controlling device is electrically connected to the curing device and at least one of the tank and the platform. The controlling device drives the tank and the platform to rotate relative to each other and to move relatively closer to or further away from each other, so a region of the platform is switchably corresponding to the first portion or the second portion. The three dimensional printing method includes following steps. Step S1: curing the liquid forming material between the platform and the first portion to form a first solidified layer ($A_1$), and then rotating the tank relative to the platform to peel off the first solidified layer ($A_1$) from the first portion and to move the first solidified layer ($A_1$) to a position corresponding to the second portion. Step S2: moving the platform and the tank relatively further away from each other. Step S3: curing the liquid forming material between the platform and the first portion to form a second solidified layer ($B_1$), and then rotating the tank relative to the platform to peel off the second solidified layer ($B_1$) from the first portion and to move the second solidified layer ($B_1$) to the position corresponding to the second portion. Step S4: moving the tank and the platform relatively further away from each other. Step S5: curing the liquid forming material between the platform and the first portion to form another first solidified layer ($A_2$) stacked on the first solidified layer ($A_1$), and rotating the tank relative to the platform to peel off the first solidified layer ($A_2$) from the first portion and to move the first solidified layer ($A_2$) to the position corresponding to the second portion. Repeating step S2 to step S5, so as to stack a plurality second solidified layers ($B_2, \ldots, B_{n-1}$) on the second solidified layer ($B_1$) layer by layer and to stack a plurality first solidified layers ($A_2, \ldots, A_n$) on the first solidified layer ($A_1$) layer by layer, wherein n is a positive integer. Finally, step S6: curing the liquid forming material between the platform and the first portion to form another second solidified layer ($B_n$) being stacked on the second solidified layer ($B_{n-1}$), and rotating the tank relative to the platform to peel off the second solidified layer ($B_n$) from the first portion, wherein a first solidified layer set $A=\{A_1, \ldots, A_{n-1}, A_n\}$ and a second solidified layer set $B=\{B_1, \ldots, B_{n-1}, B_n\}$ form the three dimensional object.

Based on the above, in the aforementioned embodiments of the three dimensional printing apparatus, the inner bottom of the tank is divided into a first portion and a second portion in step manner, wherein the first portion is higher than the second portion, and the first portion serves as a forming area of the solidified layer, and then a shear force generated by a relative rotation between the tank and the platform peels off the solidified layer from the first portion, in order to facilitate the formation of the subsequent solidified layer.

Furthermore, in a printing method based on the three dimensional printing apparatus, a location and a range of the three dimensional object relative to the first and the second portions are determined, and then desired steps are adopted. By this way, the three dimensional printing efficiency is improved. When the desired three dimensional object is corresponding to both the first portion and the second portion, the first and the second solidified layers are laminated with each other in a manner of side by side and layer by layer so as to form the three dimensional object which is more completed in structure to prevent seams between solidified layers of different portions, and such a way effectively increases the printing size and the printing accuracy, and also increases the structural strength of the printed three dimensional object.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 1:
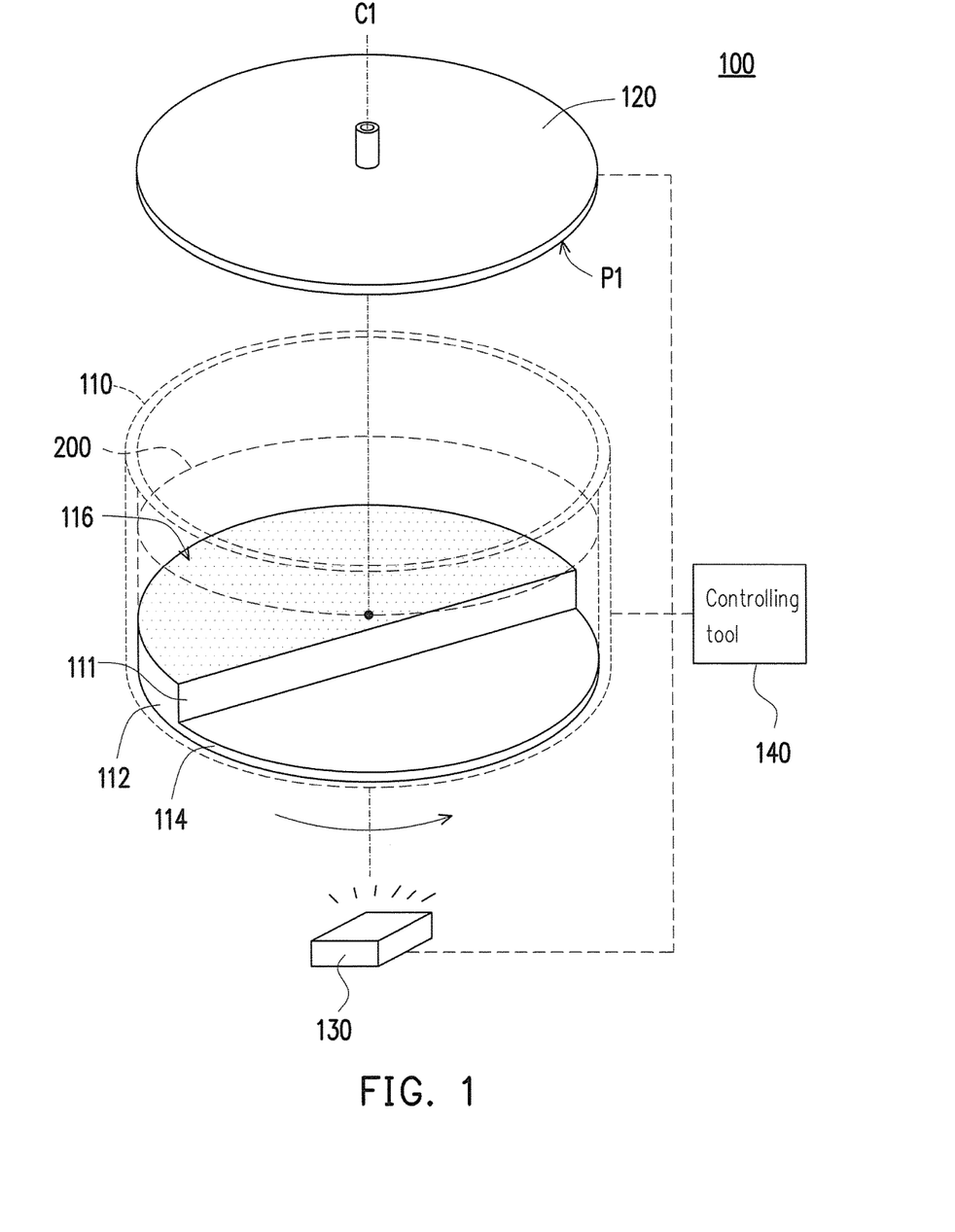
FIG. 1 is a schematic view of a three dimensional printing apparatus according to one embodiment of the disclosure.
Figure 2:
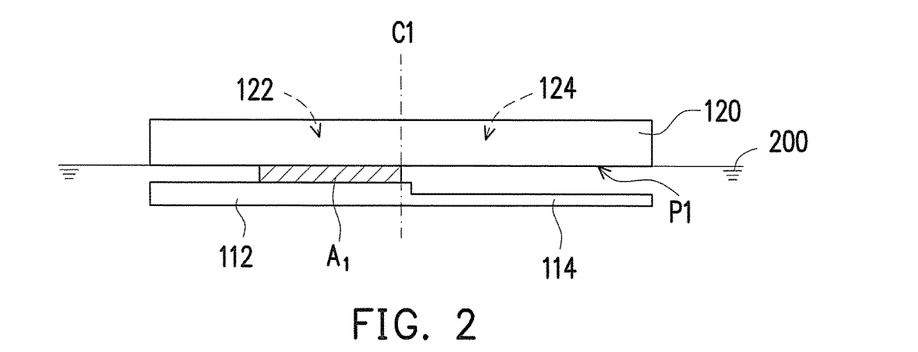
FIG. 2 to FIG. 4 are partial side views depicting the three dimensional printing apparatus in FIG. 1 in different states.
Figure 3:
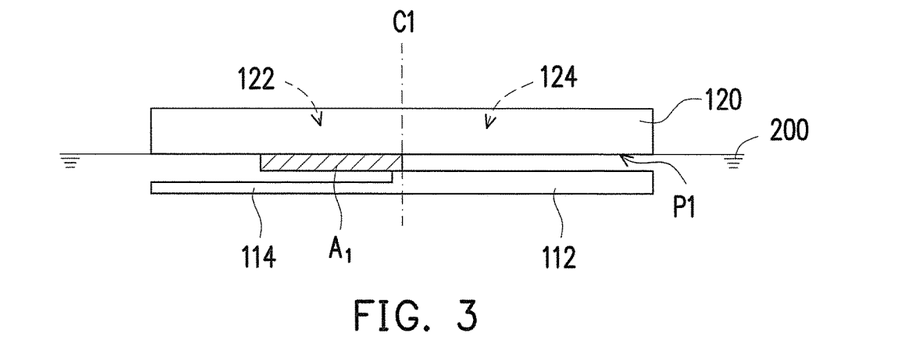
Figure 4:
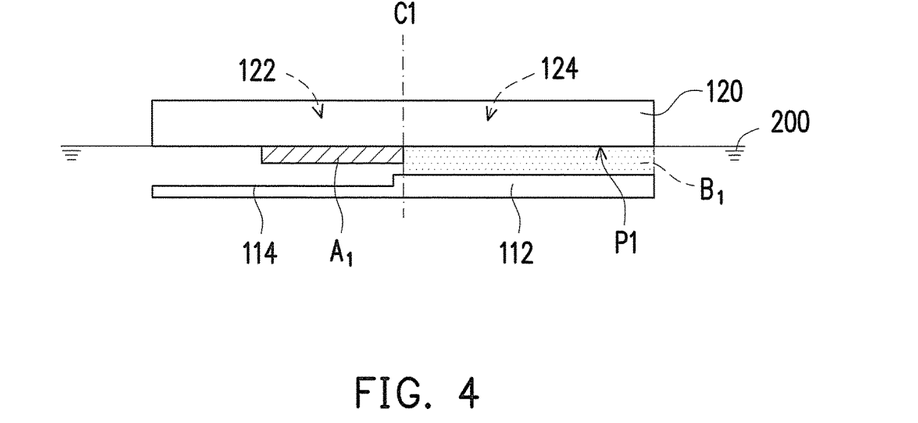

FIG. 1 is a schematic view of a three dimensional printing apparatus according to one embodiment of the disclosure. FIG. 2 to FIG. 4 are partial side views depicting the three dimensional printing apparatus in FIG. 1 in different states. Referring to FIG. 1 to FIG. 4 simultaneously, in the present embodiment, a three dimensional printing apparatus 100 includes a tank 110, a platform 120, a curing device 130, and a controlling device 140, wherein the tank 120 contains a forming material 200 in liquid, and the platform 120 is movably disposed with respect to the tank 110 to be immersed in or moved out of the liquid forming material 200. The curing device 130 is disposed next to the tank 110 or the platform 120 and configured to cure the liquid forming material 200 between the platform 120 and the tank 110, so as to form at least one solidified layer on the platform 120 (such as solidified layers $A_1$ and $B_1$ depicted in FIG. 2 to FIG. 4). The controlling device 140 is electrically connected to the curing device 130 and at least one of the tank 110 and the platform 120, so as to drive these components to move relative to each other.

In addition, the three dimensional printing apparatus 100 is, for example, a stereo lithography (SL) apparatus or a digital light processing (DLP) apparatus, the liquid forming material 200 is, for instance, photosensitive resin, thus, the controlling device 140 drives the curing device 130, such as a curing light source, to irradiate so as to make the liquid forming material 200 solidify and form on the platform 120. However, the disclosure is not limited thereto, any material and corresponding additive manufacturing technology suitable for forming the aforementioned three dimensional object can also be applied.

Based on the above, in the present embodiment, the curing device 130 cures and makes the liquid forming material 200 solidify and stack on a forming plane P1 of the platform 120 layer by layer together with the relative motion (rotating and moving away) between the tank 110 and the platform 120, so as to eventually form a three dimensional object.

Otherwise, the number of the curing devices 130 and the position of the curing device 130 with respect to the tank 110 are not limited in the disclosure. Although the curing device 130 is depicted as being located below the tank 110 in the present embodiment, the curing device 130 is disposed according to forming conditions so that the curing device 130 can effectively makes the liquid forming material 200 solidify and form on the platform 120 together with the bottom-up raising movement of the platform 120 in order to gradually form the three dimensional object. The curing device 130 may be disposed at an appropriate location next to the tank 110 or next to the platform 120.

More specifically, as shown in FIG. 1, an inner bottom of the tank 110 has a first portion 112 and a second portion 114 in step manner, wherein the first portion 112 is higher than the second portion 114, and the first portion 112 has a coating layer 116 which is made of anti-adhesive material, such as polytetrafluoroethene (PTFE) or polydimethylsiloxane (PDMS), for example, so as to peel a cured layer or a cured object off a bottom (the first portion 112) of the tank 110. The controlling device 140 drives the tank 110 to rotate about a central axis C1 and relative to the platform 120, and the controlling device 140 can further control the platform 120 to move along the central axis C1 and relative to the tank 110, so as to move the platform 120 closer to the tank 110 or further away from the tank 110. When the tank 110 is rotated about the central axis C1 and relative to the platform 120, a region of forming plane P1 of the platform 120 can be switchably corresponding to the first portion 110 or the second portion 112 of the tank 110. The term "corresponding" is used to indicate the situation that a specific region of the platform 120, at different times, is moved to right above the first portion 112 or right above the second portion 114 of the tank 110. At this time, the controlling device 140 controls to adjust the distance between the platform 120 and the first portion 112 as desired, and a minimum distance between the platform 120 and the first portion 110 is equal to a thickness of one solidified layer, for example. In other words, when the specific region of the platform 120 is corresponding to the first portion 112, the orthogonal projection of the first portion 112 on the platform 120 completely covers the specific region of the platform 120.

As a result, the curing device 140 cures the liquid forming material 200 between the platform 120 and the first portion 112, so as to form a solidified layer on the platform 120 (such as $A_1$). Next, the controlling device 140 drives the tank 110 to rotate relative to the platform 120, the solidified layer $A_1$ is relatively rotated along with the platform 120 so as to be peeled off from the first portion 112 and to be moved to the position corresponding to the second portion 114. Since the inner bottom of the tank 110 has the stepped shape, the solidified layer is actually suspended above the second portion 114. It should be noted in here, the coating layer 116 has a role in weakening the adhesive force, the viscous force, and the friction force between the solidified layer and the first portion 112. Therefore, the solidified layer is peeled off from the first portion 112 smoothly. Accordingly, the solidified layer is peeled off from the first portion 112 by the shear force generated by the relative rotation, so as to avoid applying a great force along the central axis C1 (the force acts in a direction normal to the first portion 112) to separate the solidified layer from the inner bottom of the tank 120 and to avoid wasting processing time.

Referring to FIG. 1 again, in the present embodiment, the inner bottom of the tank 120 has a circular contour and is controlled to rotate about the central axis C1, and each of rotating angles of the first portion 112 and the second portion 114 occupying the inner bottom of the tank is 180 degrees. Hence, the specific region of the platform 120 may be switched between the state of being corresponding to the first portion 112 and the state of being corresponding to the second portion 114 by a 180 degrees rotation of the tank 110.

Besides, the area of the first portion 112 is greater than the area of the second portion 114, and the central axis C1, which the tank 110 is rotated about, passes through the first portion 112. Therefore, as shown in FIG. 1, when the curing device 140 irradiates light from below the tank 110 to the first portion 112, the light is not affected by a stage difference 111 of the stepped shape and does not scatter.

Figure 5:
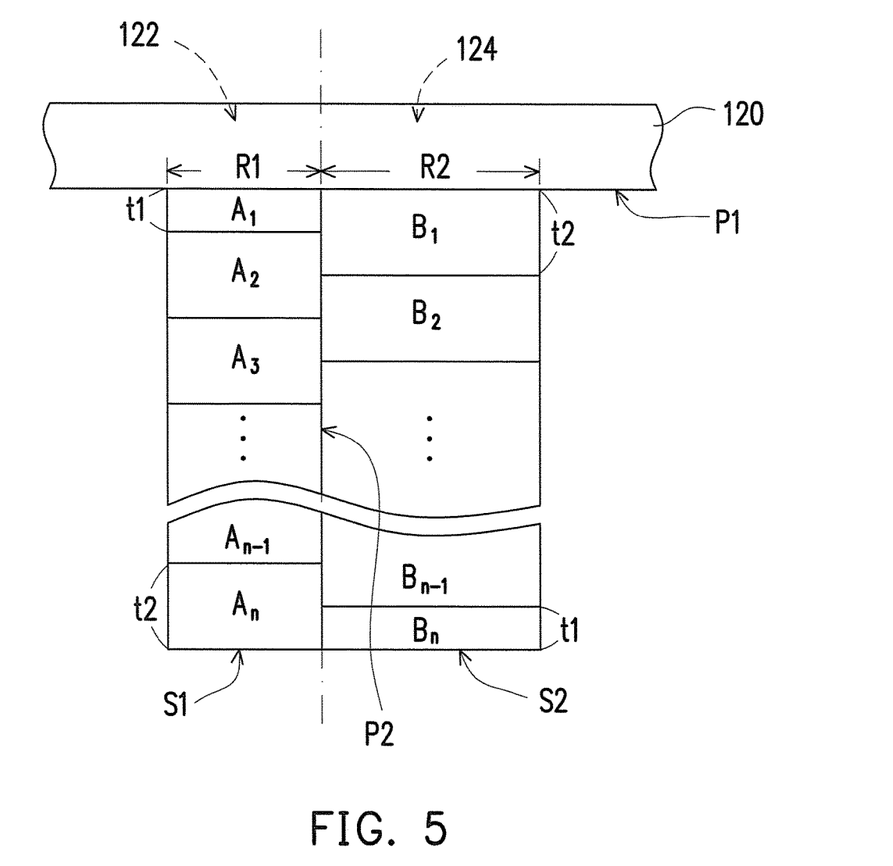
FIG. 5 is a partial schematic view depicting the three dimensional printing apparatus in FIG. 1 after a three dimensional object is printed.
Figure 6:
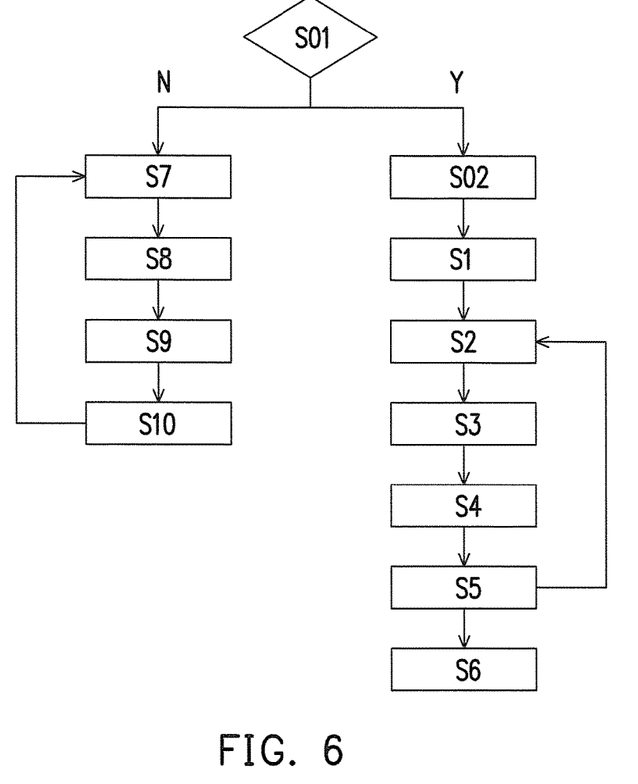
FIG. 6 is a flow chart depicting a three dimensional printing method in one embodiment of the disclosure.

The process of gradually forming the three dimensional object by the three dimensional printing apparatus 100 is described as followings. FIG. 5 is a partial schematic view depicting the three dimensional printing apparatus in FIG. 1 after a three dimensional object is completely printed, and FIG. 5 follows the process shown in FIG. 2 to FIG. 4. FIG. 6 is a flow chart depicting a three dimensional printing method in one embodiment of the disclosure. Referring to the flow chart in FIG. 6 and referring to FIG. 2 to FIG. 5, in the present embodiment, firstly in step S01, the desired three dimensional object 300 is determined whether to be out of range of the first portion 112 of the inner bottom of the tank 110. That is to say, the occupied area on the platform 120 of the desired three dimensional object 300 is confirmed whether to be corresponding to both the first portion 112 and the second portion 114 of the inner bottom of the tank 110. In other words, it needs to be confirmed that the orthogonal projection of the first portion 112 on the platform 120 cannot completely cover the occupied area on the platform 120 of the desired three dimensional object 300, and the occupied area on the platform 120 of the desired three dimensional object 300 is completely covered by the orthogonal projections of the first portion 112 and the second portion 124 on the platform 120. If yes, step S02 is performed, the platform 120 is divided into a third portion 122 and a fourth portion 124 that are respectively and switchably corresponding to the first portion 112 and the second portion 114 of the tank 110. That is to say, a predetermined area of the platform 120 that the three dimensional object 300 will be located on is divided into the third portion 122 and the fourth portion 124, and for example, the first portion 112 is corresponding to the third portion 122 and the second portion 114 is corresponding to the fourth portion 124 as shown in FIG. 2. Simultaneously, the three dimensional object 300 is divided into a first solidified layer set $A=\{A_1, \ldots, A_{n-1}, A_n\}$ and a second solidified layer set $B=\{B_1, \ldots, B_{n-1}, B_n\}$, wherein the first solidified layer set A is located at the third portion 122, the second solidified layer set B is located at the fourth portion 124, and an area RI of the third portion 122 is smaller than an area of the fourth portion 124.

It should be noted here, the steps S01 and S02 are preparing steps before the three dimensional object 300 is physically printed. In the present embodiment, the three dimensional object 300 is constructed by computer-aided design (CAD) software to obtain the design information of 3-D model, and the design information is further converted to multiple thin cross sections (quasi-two-dimensional), such as the first solidified layer set A and the second solidified layer set B.

Subsequently, the three dimensional printing apparatus 100 starts to physically print the object according to the design information of 3-D model.

In step S1, as shown in FIGS. 2 and 3, the liquid forming material 200 between the platform 120 and the first portion 112 is cured to form a first solidified layer ($A_1$). Next, the tank 110 is rotated with respect to the platform 120 so that the first solidified layer ($A_1$) is peeled off from the first portion 112 and moved to the position corresponding to the second portion 114. At this time, the tank 110 is rotated 180 degrees about the central axis C1 and relative to the platform 120, so the fourth portion 124 is corresponding to the first portion 112, the third portion 122 is corresponding to the second portion 114, and the first solidified layer ($A_1$) is peeled off from the first portion 112 by shear force.

Subsequently, as shown in FIG. 4, in step S2, the platform 120 and the tank 110 are moved relatively further away from each other. Next, in step S3, the liquid forming material 200 between the platform 120 and the first portion 112 is cured to form a second solidified layer ($B_1$), and then the tank 110 is rotated with respect to the platform 120 so that the second solidified layer ($B_1$) is peeled off from the first portion 112 and moved to the position corresponding to the second portion 114 (FIG. 4 only depicts the second solidified layer ($B_1$) being cured, and the rotation of the tank 110 with respect to the platform 120 is similar to the rotation depicted in FIGS. 2-3 and will not be repeated). In step S4, the platform 120 and the tank 110 are moved relatively further away from each other again, so as to continuously stack the solidified layers.

Next, step S2 to step S5 are repeated, so as to stack a plurality second solidified layers ($B_2, \ldots, B_{n-1}$) on the second solidified layer ($B_1$) layer by layer and to stack a plurality first solidified layers ($A_2, \ldots, A_n$) on the first solidified layer ($A_1$) layer by layer, wherein n is a positive integer, as shown in FIG. 5. In the procedure of layer stacking, the first solidified layers ($A_1, \ldots, A_n$) and the second solidified layers ($B_1, \ldots, B_{n-1}$) are also connected side by side on a central cross-section plane P2 where the central axis C1 passing through. Finally, in step S6, the liquid forming material 200 between the platform 120 and the first portion 112 is cured to form a second solidified layer ($B_n$), and the tank 110 is rotated relative to the platform 120 so that the second solidified layer ($B_n$) is peeled off from the first portion 112. As a result, the first solidified layer set $A=\{A_1, \ldots, A_{n-1}, A_n\}$ and the second solidified layer set $B=\{B_1, \ldots, B_{n-1}, B_n\}$ form the three dimensional object completely.

Referring to FIGS. 5 and 6 again, it is worth mentioning that since the three dimensional object is corresponding to both the first portion 112 and the second portion 114, the side by side stacking with different thickness method is used in the present embodiment. Therefore, the first solidified layer set A and the second solidified layer set B are connected to each other to form the three dimensional object. At the same time, the thickness of the first solidified layer ($A_1$) is equal to the thickness of the second solidified layer ($B_n$), and the thickness of each of the first solidified layers ($A_2, \ldots, A_n$) is equal to the thickness of each of the second solidified layers ($B_1, \ldots, B_{n-1}$). That is to say, in the present embodiment, the thickness of the first solidified layer ($A_1$) is equal to one-half of the thickness of each of the first solidified layers ($A_2, \ldots, A_n$) and also equal to one-half of the thickness of each of the second solidified layers ($B_1, \ldots, B_{n-1}$). In addition, the thickness of the second solidified layer ($B_n$) is equal to one-half of the thickness of each of the second solidified layers ($B_1, \ldots, B_{n-1}$) and also equal to one-half of the thickness of each of the first solidified layers ($A_2, \ldots, A_n$). As a result, in step S2 and step S4, a moving distance of the tank 110 relatively further away from the platform 120 is equal to one-half of the thickness of each of the first solidified layers ($A_2, \ldots, A_n$) and also equal to one-half of the thickness of each of the second solidified layers ($B_2, \ldots, B_{n-1}$). Furthermore, in forming the first solidified layers ($A_1, \ldots, A_{n-1}$) and the second solidified layers ($B_1, \ldots, B_{n-1}$), the distance between the $n^{th}$ first solidified layer (e.g. $A_2$) and the platform 120 is different from the distance between the $n^{th}$ second solidified layer (e.g. $B_2$) and the platform 120, wherein a thickness t1 is one-half of a thickness t2, as depicted in FIG. 5. In other words, although the first solidified layer and the second solidified layer have the same ordinal number (e.g. $A_2$ and $B_2$), the distance between the first solidified layer and the platform is different from the distance between the second solidified layer and the platform. However, a surface S1 of the first solidified layer ($A_n$) facing away from the platform 120 and another surface S2 of the second solidified layer ($B_n$) facing away from the platform 120 are coplanar, so as to form the side by side stacking structure shown in FIG. 5. The first solidified layer set A and the second solidified layer set B are connected to each other at a central cross-section plane P2 of the inner bottom of the tank 110, and the central axis C1 is located on the central cross-section plane P2. Moreover, in step S1, step S3, and step S5, the tank 110 is rotated 180 degrees about the central axis C1 and relative to the platform 120.

Figure 7:
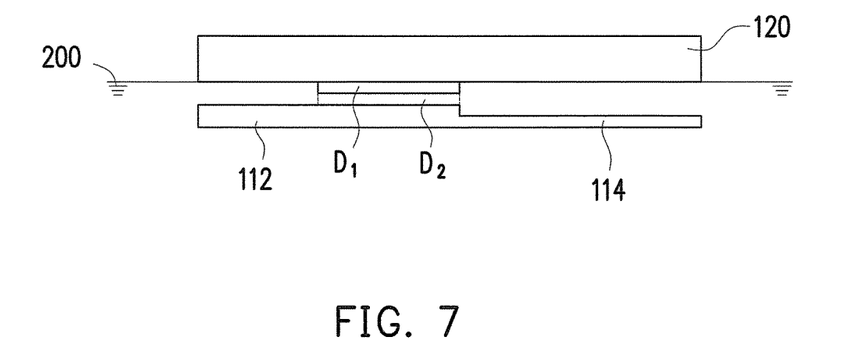
FIG. 7 is a schematic view depicting a state of a three dimensional printing apparatus in another embodiment of the disclosure.

FIG. 7 is a schematic view depicting state of a three dimensional printing apparatus in another embodiment of the disclosure, and FIG. 7 depicts another process of the flow chart in FIG. 6. Referring to FIGS. 6 and 7 at the same time, as described above, in the step S01, if the three dimensional object 300 is determined not being out of range of the first portion 112 (which also means that the orthogonal projection of the first portion 112 on the platform 120 completely cover the occupied area on the platform 120 of the desired three dimensional object 300), then the subsequent step S7 is proceeded, the liquid forming material 200 between the platform 120 and the first portion 112 is cured to form a solidified layer ($D_1$). Next, the tank 110 is rotated relative to the platform 120 so that the solidified layer ($D_1$) is peeled off from the first portion 112 and moved to the position corresponding to the second portion 114, as described in step S1. After that, in the step S8, the platform 120 and the tank 110 are moved relatively further away from each other, as described in step S2. However, at this time, the moving distance of the tank 110 relatively further away from the platform 120 is equal to a thickness of the solidified layer ($D_1$). In step S9, the tank 110 is rotated with respect to the platform 120 so the solidified layer ($D_1$) is corresponding to the first portion 112 again. In step S10, the liquid forming material 200 between the solidified layer ($D_1$) and the first portion 112 is cured to form another solidified layer ($D_2$) stacking on the solidified layer ($D_1$). Next, the steps S7-S10 are repeated until the three dimensional object is completely printed. In other words, the three dimensional object in the present embodiment is formed by a solidified layer set D={$D_1$, . . . , $D_{n-1}$, $D_n$} that are gradually stacked on the platform 120, wherein n is a positive integer, and the solidified layer set D is located within the same region of the platform 120.

In the present embodiment, the solidified layers are stacked on the same region of the platform, so the steps S8 and S9 can be executed at a same time. That is to say, the tank is rotated relative to the platform and the platform is raised relative to tank simultaneously. Therefore, the processing time is shortened.

In the aforementioned embodiments of the disclosure, the inner bottom of the tank of the three dimensional printing apparatus is divided into the first portion and the second portion in step manner, wherein the higher portion, which is the first portion, serves as a forming area of the solidified layer, and shear force generated by the relative rotation between the tank and the platform is used to peel off the solidified layer from the first portion, in order to facilitate the formation of the subsequent solidified layer.

Furthermore, in a printing method based on the three dimensional printing apparatus, a location and a range of the three dimensional object relative to the first and the second portions are determined firstly, and then desired steps are adopted. By this way, the three dimensional printing efficiency is improved. When the desired three dimensional object is corresponding to both the first portion and the second portion, the first and the second solidified layers are laminated with each other in a side by side stacking with different thickness method, such that the three dimensional object is formed more completed in structure to prevent seams between solidified layers, and then to effectively increase the printing size and the printing accuracy, and also to increase the structural strength of the printed three dimensional object.

On the contrary, when the desired three dimensional object is determined not being out of range of the first portion, after the tank is rotated with respect to the platform to peel off the solidified layer and the platform is raised relative to tank, the tank is rotated with respect to platform again so the solidified layer is also rotated to return to the position corresponding to the first portion. Next, another solidified layer is continuously printed and directly stacked on the previous solidified layer.

Although the disclosure has been disclosed with reference to the aforesaid embodiments, they are not intended to limit the disclosure. It will be apparent to one of ordinary skill in the art that modifications and variations to the described embodiments may be made without departing from the spirit and the scope of the disclosure. Accordingly, the scope of the disclosure will be defined by the attached claims and not by the above detailed descriptions.

What is claimed is:

1. A three dimensional printing method, applicable to the three dimensional printing apparatus to print a three dimensional object on the platform, the three dimensional object comprising a plurality of first solidified layers and a plurality of second solidified layers, the three dimensional printing apparatus comprising a tank, a platform, a curing device, and a controlling device, the tank containing a liquid forming material, an inner bottom of the tank having a first portion and a second portion in step manner, the first portion being higher than the second portion, the platform movably disposed in the tank to be immersed in or moved out of the liquid forming material, wherein the tank and the platform are rotated relative to each other, and an region of the platform is corresponding to the first portion or the second portion, the curing device disposed next to the tank or the platform, the liquid forming material between the platform and the first portion being cured by the curing device to form a solidified layer, and the solidified layer being peeled off the first portion by relative rotation of the platform and the tank, the controlling device electrically connected to the curing device and at least one of the tank and the platform, wherein the curing device cures the liquid forming material between the platform and the first portion to form the solidified layer when the region is corresponding to the first portion, and then the controlling device drives the tank and the platform to rotate relatively so as to peel off the solidified layer from the first portion and to move the solidified layer to a position corresponding to the second portion, the three dimensional printing method comprising:

step S1 : curing the liquid forming material between the platform and the first portion to form a first solidified layer ($A_1$), and then rotating the tank relative to the platform to peel off the first solidified layer ($A_1$) from the first portion and to move the first solidified layer ($A_1$) to a position corresponding to the second portion;

step S2: moving the platform and the tank relatively further away from each other;

step S3: curing the liquid forming material between the platform and the first portion to form a second solidified layer ($B_1$), and then rotating the tank relative to the platform to peel off the second solidified layer ($B_1$) from the first portion and to move the second solidified layer ($B_1$) to the position corresponding to the second portion;

step S4: moving the tank and the platform relatively further away from each other;

step S5: curing the liquid forming material between the platform and the first portion to form another first solidified layer ($A_2$) stacked on the first solidified layer ($A_1$), and rotating the tank relative to the platform to peel off the first solidified layer ($A_2$) from the first portion and to move the first solidified layer ($A_2$) to the position corresponding to the second portion;

repeating step S2 to step S5, so as to stack a plurality second solidified layers ($B_2, \ldots, B_{n-1}$) on the second solidified layer ($B_1$) and to stack a plurality first solidified layers ($A_2, \ldots, A_n$) on the first solidified layer ($A_1$), wherein n is a positive integer; and step S6: curing the liquid forming material between the platform and the first portion to form another second solidified layer ($B_n$) being stacked on the second solidified layer ($B_{n-1}$), and rotating the tank relative to the platform to peel off the second solidified layer ($B_n$) from the first portion, wherein a first solidified layer set $A=\{A_1, \ldots A_{n-1}, A_n\}$ and a second solidified layer set $B=\{B_1, \ldots B_{n-1}, B_n\}$ form the three dimensional object.

2. The three dimensional printing method as recited in claim 1, wherein a thickness of the first solidified layer ($A_1$) is equal to a thickness of the second solidified layer ($B_n$), and a thickness of each of the first solidified layers ($A_2, \ldots, A_n$) is equal to a thickness of each of the second solidified layers ($B_1, \ldots, B_{n-1}$).

3. The three dimensional printing method as recited in claim 1, wherein a thickness of the first solidified layer ($A_1$) is equal to one-half of a thickness of each of the first solidified layers ($A_2, \ldots, A_n$) and also equal to one-half of a thickness of each of the second solidified layers ($B_1 \ldots B_{n-1}$), a thickness of the second solidified layer ($B_n$) is equal to one-half of the thickness of each of the second solidified layers ($B_1, \ldots, B_{n-1}$) and also equal to one-half of the thickness of each of the first solidified layers ($A_2, \ldots, A_n$).

4. The three dimensional printing method as recited in claim 1, wherein, in step S2 and step S4, a moving distance of the tank relatively further away from the platform in is equal to one-half of a thickness of each of the first solidified layers ($A_2, \ldots, A_n$) and also equal to one-half of a thickness of each of the second solidified layers ($B_2, \ldots, B_{n-1}$).

5. The three dimensional printing method as recited in claim 1, wherein a surface of the first solidified layer ($A_n$) facing away from the platform and another surface of the second solidified layer ($B_n$) facing away from the platform are coplanar.

6. The three dimensional printing method as recited in claim 1, wherein, in the first solidified layers ($A_1, \ldots, A_{n-1}$) and the second solidified layers ($B_1, \ldots, B_{n-1}$), a distance between one of the first solidified layers and the platform is different from a distance between one of the second solidified layer and the platform, wherein the one of the first solidified layers and the one of the second solidified layers have a same ordinal number.

7. The three dimensional printing method as recited in claim 1, wherein, in step S1, step S3, and step S5, the tank is rotated 180 degrees about a central axis and relative to the platform.

8. The three dimensional printing method as recited in claim 7, wherein the first solidified layer set A and the second solidified layer set B are connected to each other at a central cross-section plane of the inner bottom of the tank, and the central axis is located on the central cross-section plane.

9. The three dimensional printing method as recited in claim 7, wherein an area of the first portion is greater than an area of the second portion, and the central axis passes through the first portion.

10. The three dimensional printing method as recited in claim 1, further comprising:

determining whether the three dimensional object is out of range of the first portion; and when the three dimensional object is out of range of the first portion, dividing the platform into a third portion and a fourth portion that are respectively and switchably corresponding to the first portion and the second portion, and dividing the three dimensional object into the first solidified layer set $A=\{A1, \ldots An-1, An\}$ and the second solidified layer set $B=\{B1, \ldots Bn-1, Bn\}$, wherein the first solidified layer set A is located at the third portion, and the second solidified layer set B is located at the fourth portion.

* * * * *